United States Patent
Hsu et al.

(10) Patent No.: US 7,835,177 B2
(45) Date of Patent: Nov. 16, 2010

(54) PHASE CHANGE MEMORY CELL AND METHOD OF FABRICATING

(75) Inventors: Hong-Hui Hsu, Hsinchu (TW); Chien-Min Lee, Hsinchu (TW); Wen-Han Wang, Hsinchu (TW); Min-Hung Lee, Hsinchu (TW); Te-Sheng Chao, Hsinchu (TW); Yen Chuo, Hsinchu (TW); Yi-Chan Chen, Hsinchu (TW); Wei-Su Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 217 days.

(21) Appl. No.: 11/493,595

(22) Filed: Jul. 27, 2006

(65) Prior Publication Data
US 2007/0138595 A1   Jun. 21, 2007

(30) Foreign Application Priority Data
Dec. 21, 2005  (TW) ................................ 94145589 A

(51) Int. Cl.
*G11C 11/00* (2006.01)
(52) U.S. Cl. .................. 365/163; 365/148; 365/100; 257/2; 257/60; 257/E29.08
(58) Field of Classification Search .............. 365/94, 365/100, 148, 163; 257/2–5, 149, 296, E31.047, 257/E27.006; 438/29, 95, 96
See application file for complete search history.

(56) References Cited

U.S. PATENT DOCUMENTS

| | | | |
|---|---|---|---|
| 6,114,713 A * | 9/2000 | Zahorik | .......................... 257/4 |
| 6,746,892 B2 | 6/2004 | Lee et al. | |
| 6,800,563 B2 | 10/2004 | Xu | |
| 6,867,425 B2 | 3/2005 | Wicker | |
| 2002/0006735 A1 * | 1/2002 | Zahorik | ..................... 438/763 |
| 2005/0001284 A1 | 1/2005 | Pellizzer | |

* cited by examiner

*Primary Examiner*—Son T Dinh
*Assistant Examiner*—Harry W Byrne
(74) *Attorney, Agent, or Firm*—Rabin & Berdo, P.C.

(57) ABSTRACT

A phase change memory (PCM) cell fabricated by etching a tapered structure into a phase change layer, and planarizing a dielectric layer on the phase change layer until a tip of the tapered structure is exposed for contacting a heating electrode. Therefore, the area of the exposed tip of the phase change layer is controlled to be of an extremely small size, the contact area between the phase change layer and the heating electrode is reduced, thereby lowering the operation current.

9 Claims, 19 Drawing Sheets

PHASE CHANGE MEMORY CELL AND METHOD OF FABRICATING

CROSS-REFERENCE TO RELATED APPLICATIONS

This non-provisional application claims priority under 35 U.S.C. § 119(a) on Patent Application No(s). 094145589 filed in Taiwan, R.O.C. on Dec. 21, 2005, the entire contents of which are hereby incorporated by reference.

BACKGROUND OF THE INVENTION

1. Field of Invention

The present invention relates to a nonvolatile memory device, and more particularly, to a phase change memory cell and a fabricating method thereof.

2. Related Art

A phase change memory (PCM) is a nonvolatile memory device. The resistance value of the device can be transformed by changing a crystalline phase of the phase change material through a heating effect. In other words, the PCM can be regarded as a programmable resistor which is reversibly changeable between a high resistance state and a low resistance state.

At present, a chalcogenide phase change material is widely applied in forming the memory cell of the PCM. The chalcogenide is a substance with various solid-state phases, and can be a thermo-induced transition along with a temperature variation. The chalcogenide has a high resistance value when in an amorphous state (with an irregular atomic arrangement), while has a low resistance value when in a crystalline state (with a regular atomic arrangement). Herein, the temperature variations can be achieved by providing current or optical pulses, or by other manners.

As for the structure, the coupling interface of the current path and the phase change material is designed into a small hole, to concentrate the current, such that the phase change material near the small hole has a high current density, thereby changing the phase state of the chalcogenide. The current heating effect of the resistance value on the phase change layer is a function of the area of the coupling interface. Therefore, the smaller the area of the coupling interface is, the better it is. And the higher the resistance value is, the higher the heating efficiency of unit current of the phase change material is, and therefore the operation current can be lowered.

In general, in the PCM, a transistor is used as a select device to control the current passing through the PCM cell and the voltage applied on the chalcogenide. Therefore, in order to reduce the size and power consumption of the PCM, the operation current for the PCM cell must be reduced. The current heating effect of the resistance value in the interface region is a function of the contact area of the interface region. Therefore, in the conventional technique, the object of dropping the operation current is achieved by reducing the area of the interface region between the current path and the phase change material.

Conventionally, the PCM cell is of a T-shape structure, wherein a current path through a phase change layer 130 is formed between the upper and lower electrodes 110, 120, as shown in FIG. 1. A small hole is formed on the dielectric layer 140 by a lithographic process, and then filled with a metal material to form the lower electrode 120, such that the contact area between the lower electrode 120 and the phase change layer 130 is reduced. Herein, the contact area between the phase change material (i.e. the phase change layer) and the lower electrode for heating is limited by the capability of the lithographic process. And that, the small hole is filled with a metal material, easily causes a problem of inadequate step coverage. Moreover, in actuality, it is uneasy to update the lithographic process, because the equipment must be renewed and personnel must be trained, so that a great deal of labor and costs are consumed.

Therefore, a tapered design is proposed, in which a tip of the tapered lower electrode contacts the phase change layer, thereby reducing the contact area between the two.

Referring to FIG. 2, a heating electrode 122 and multiple conductive substrates 121*a*, 121*b*, 121*c*, 121*d*, which stack in order, are etched in sync to form the tapered structure using an isotropic etching technique, and then the tapered heating electrode 122 contacts the phase change layer 130 to reduce the contact area, as shown in U.S. Pat. No. 6,800,563 B2. However, in actuality, several different materials must be taken into consideration simultaneously when the etching is carried out according to this method. Therefore, the etched pattern will be of a poor uniformity and cannot satisfy the requirements.

Furthermore, referring to FIG. 3, an etching and a photoresist lateral downsizing are carried out alternately, so as to etch the dielectric layer 142 to a tapered structure. Then a heating electrode 122 is deposited. Therefore, the heating electrode 122 at the tip contacts the phase change layer 130, thereby reducing the contact area, as shown in U.S. Pat. No. 6,746,892 B2.

Moreover, an edge contact PCM cell has been developed, as shown in FIG. 4. The heating electrode 122 is disposed in the interlayer bordering on the trench sidewall. And the contact area between the heating electrode 122 and the phase change layer 130 is controlled by the thickness of the heating electrode 122. However, there is a difficulty in filling the hole with the phase change material, and it leads to a poor contact of the lateral contact interface to cause a problem in the uniformity and reliability of the device. Moreover, the heating electrode extends transversally to contact the phase change material, such that the current path of the heating electrode is too long. Also, the heating electrode has high resistance to cause extra power consumption.

Furthermore, another PCM cell is a lateral cell, as shown in U.S. Pat. No. 6,867,425. Referring to FIG. 5, the electrodes 112, 124 are disposed in the interlayer bordering on the trench sidewall, and the contact area between the electrodes 112 and the phase change layer 130 is controlled by the thickness of the electrodes 112, 124. Herein, the operation current can be reduced by the lateral contact, and the path of the current flowing through the phase change material can be shortened by controlling the distance between the two electrodes, to reduce the power consumption when operating the device. However, the material of an heating electrode is usually of a high resistance, and when it serves as a lead, it will cause an increase in parasitic resistance, and further cause extra power consumption. Furthermore, when the distance between the two electrodes is very small, operational power consumption can be reduced, but there are the problems of difficulty, uniformity, and reliability for filling the hole with the phase change material and contact between the phase change material and the sidewall.

It can be known from the above that there are many methods for reducing the contact area between the current path and the phase change material, but in the implementation, the methods are easily limited by process equipment and/or technical ability. Therefore, many methods for reducing the contact area between the current path and the phase change material are provided, so as to be flexibly combined with the equipment and technology of the pre process and/or post process, thereby accelerating the development of this field. Thus, those skilled in the art have devoted themselves to providing a simple, highly practicable process, for reducing the contact area between the current path and the phase change material.

SUMMARY OF THE INVENTION

In view of above problems, the main object of the present invention is to provide a phase change memory cell and a fabricating method thereof, for solving the problem of how to reduce the contact area between a phase change layer and a heating electrode existing in the prior art.

Therefore, in order to achieve the above object, the method for fabricating a phase change memory (PCM) cell in the invention is provided. First, a first dielectric layer with a first electrode therein is provided. Then, a phase change layer is deposited on the first dielectric layer and the first electrode. The phase change layer is etched into a tapered structure, wherein the area of the bottom of the tapered structure close to the first electrode is larger than the tip of the tapered structure far from the first electrode. A second dielectric layer is deposited on the phase change layer. The second dielectric layer is planarized until the tip of the tapered structure is exposed. An electrode is formed on the exposed tip of the tapered structure.

The invention further discloses a PCM cell, which comprises a first dielectric layer, a first electrode, a phase change layer, a second dielectric layer, and a heating electrode. The first electrode is disposed in the first dielectric layer. The phase change layer with a tapered structure is disposed on the first electrode, wherein an area of the bottom of the tapered structure close to the first electrode is larger than the tip of the tapered structure far from the first electrode. The second dielectric layer is disposed on the phase change layer, and exposes the tip of the tapered structure. The heating electrode is disposed on the second dielectric layer, and contacts the exposed tip of the tapered structure, to generate a Joule heat in the phase change layer.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and which thus is not limitative of the present invention, and wherein.

DETAILED DESCRIPTION

Embodiments are listed below for illustration. The content of the present invention is illustrated in detailed by the embodiments below accompanied with the drawings. The symbols mentioned in the illustration are the symbols in the reference drawings.

Figure 1:
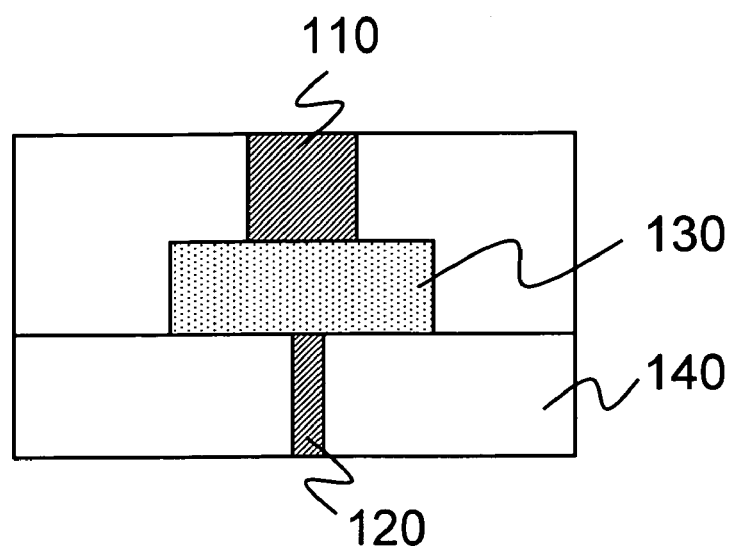
FIG. 1 is a sectional view of a conventional phase change memory (PCM) cell.
Figure 2:
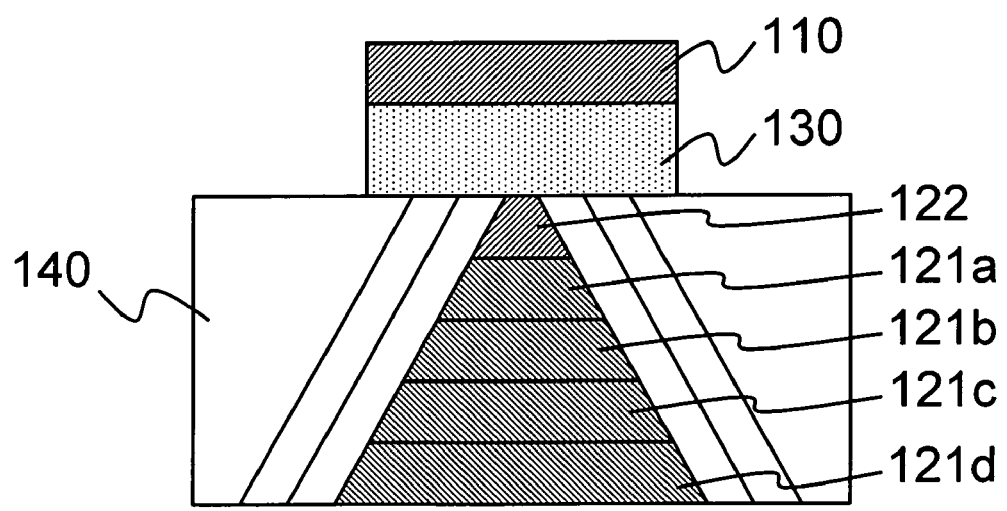
FIG. 2 is a sectional view of another conventional PCM cell.
Figure 3:
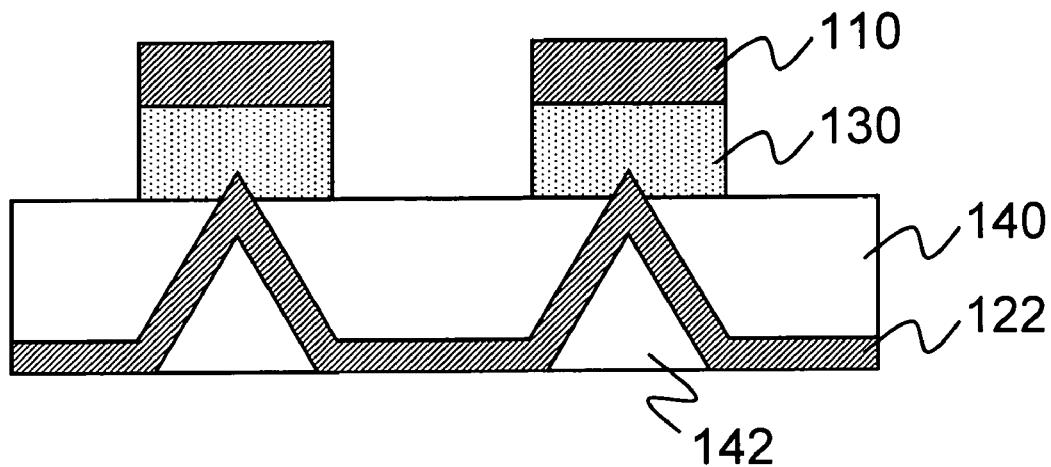
FIG. 3 is a sectional view of still another conventional PCM cell.
Figure 4:
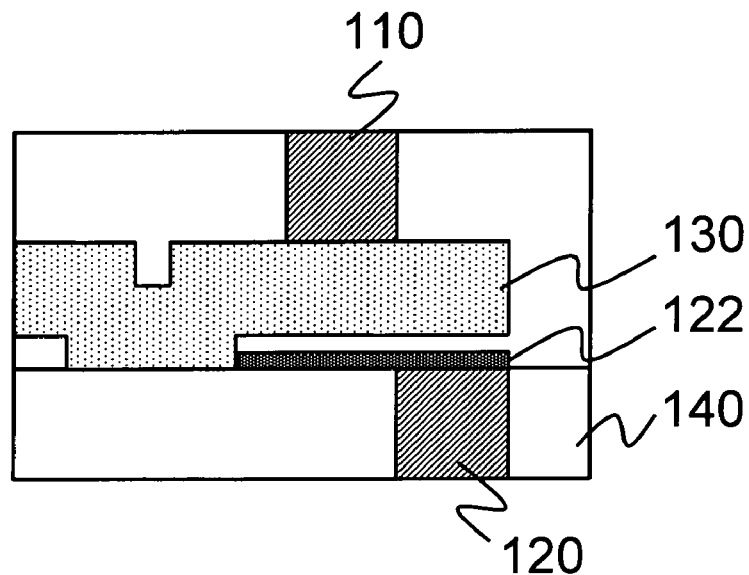
FIG. 4 is a sectional view of further still another conventional PCM cell.
Figure 5:
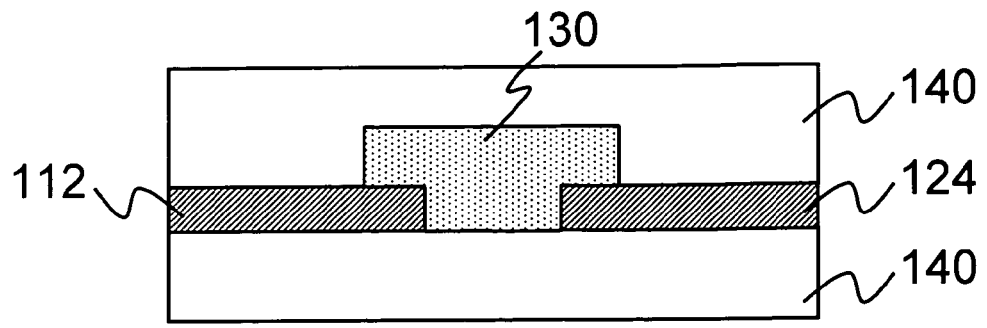
FIG. 5 is a sectional view of yet another conventional PCM cell.
Figure 6:
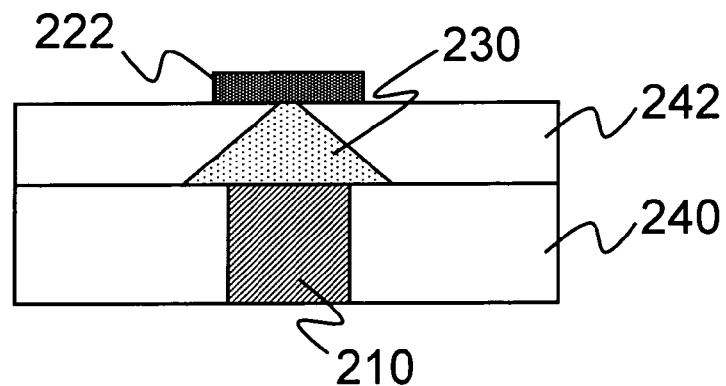
FIG. 6 is a sectional view of a PCM cell according to a first embodiment of the invention.
Figure 7:
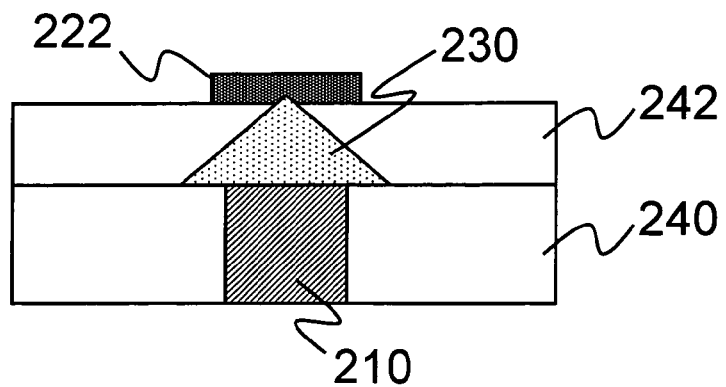
FIG. 7 is a sectional view of a PCM cell according to a second embodiment of the invention.

Referring to FIGS. 6 and 7, phase change memory (PCM) cells according to the first and second embodiments of the invention are shown. The PCM cell has a first electrode 210, a phase change layer 230, a heating electrode 222, a first dielectric layer 240, and a second dielectric layer 242.

The first electrode 210 is formed in the first dielectric layer 240. The phase change layer 230 is disposed on the first electrode 210. The phase change layer 230 is a tapered structure with a large bottom (i.e. a portion close to the first electrode 210) area and a small tip (i.e. a portion far from the first electrode 210) disposed in the second dielectric layer 242, and exposes its tip. The heating electrode 222 is disposed on the phase change layer 230, and contacts the exposed tip, to generate a Joule heat in the phase change layer. The portion of the phase change layer 230 exposed by the second dielectric layer 242 is a plane (as shown in FIG. 6), or a pyramid (as shown in FIG. 7). Therefore, as long as the size of the exposed plane or pyramid of the tip of the phase change layer 230 is controlled to be of an extremely small size, the contact area between the phase change layer 230 and the heating electrode 222 can be reduced; thereby the operation current is lowered.

The material of the first electrode is a conductive material with good conductivity, such as Al, W, Mo, Ti, or Cu. The material of the first and second dielectric layers is a dielectric material, such as $SiO_2$ or $Si_3N_4$. The material of the phase change layer is a phase change material, for example, chalcogenide, such as GeSbTe alloy, GeSbSnTe alloy, or IrGeSbTe alloy. The material of the heating electrode is a conductive material with a high resistance value, such as Ti, Ta, TiN, TaN, TiAlNx, TiCNx, TaW, TiW, TaO, poly-Si, TaSiO, C, SiC, or GeN.

Figure 8:
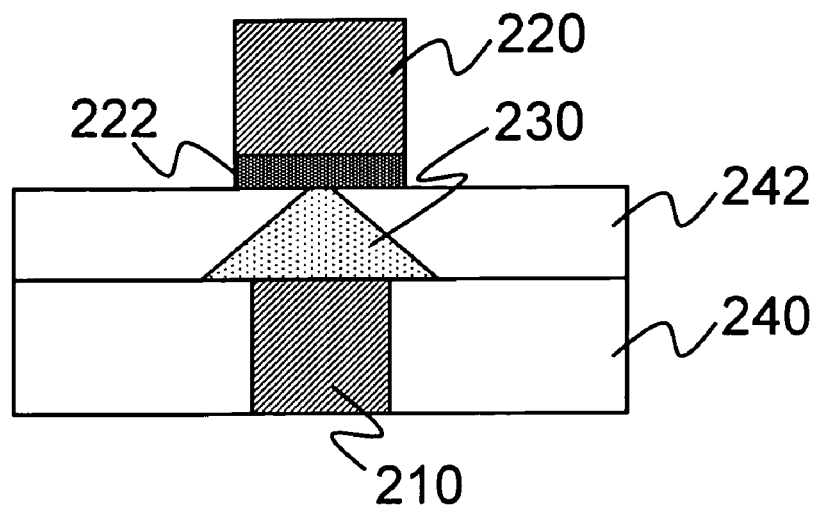
FIG. 8 is a sectional view of a PCM cell according to a third embodiment of the invention.
Figure 9:
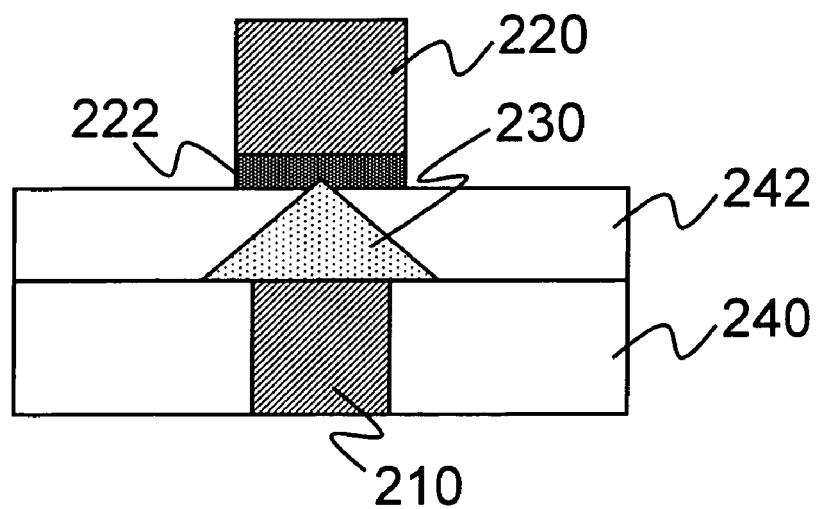
FIG. 9 is a sectional view of a PCM cell according to a fourth embodiment of the invention.

Moreover, a second electrode 220 can be disposed on the heating electrode 222, for transferring an operation current, as shown in FIGS. 8 and 9. The material of the second electrode is a conductive material with good conductivity, such as Al, W, Mo, Ti, or Cu.

Figure 10:
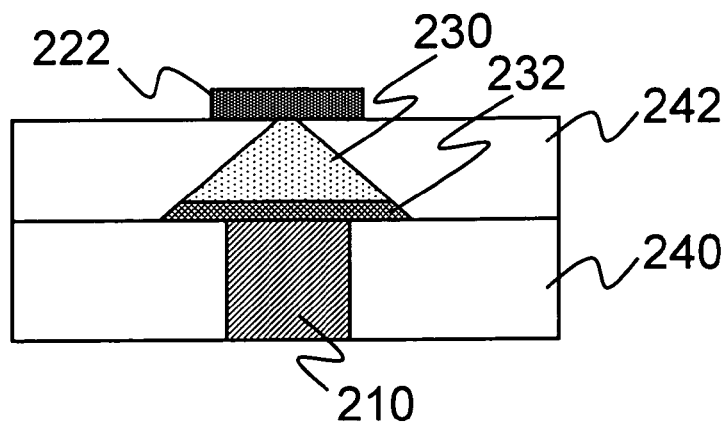
FIG. 10 is a sectional view of a PCM cell according to a fifth embodiment of the invention.
Figure 11:
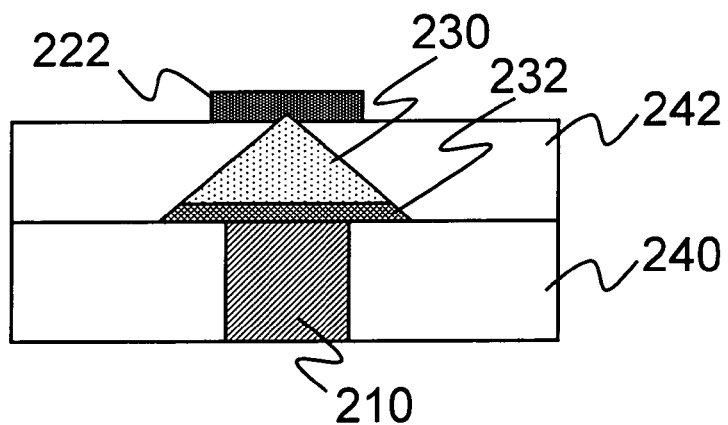
FIG. 11 is a sectional view of a PCM cell according to a sixth embodiment of the invention.

Furthermore, a diffusion barrier layer 232 is formed between the phase change layer 230 and the first electrode 210, to prevent mutual diffusion of the metal materials between the phase change layer 230 and the first electrode 210, as shown in FIGS. 10 and 11. The material of the diffusion barrier layer is a material with good thermal stability, such as TiN, TaN, TiSiN, TaSiN, or TiW.

Herein, the PCM cell according to the invention is fabricated by using the following fabricating method.

Figure 12A:
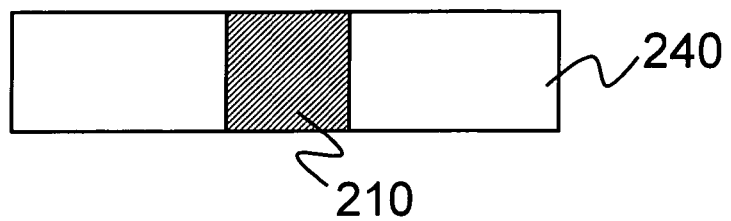
FIG. 12A is a sectional view showing an embodiment of providing a first dielectric layer according to a fabricating method of the invention.

At first, a first dielectric layer 240 with a first electrode 210 is provided, as shown in FIG. 12A.

Figure 12B:
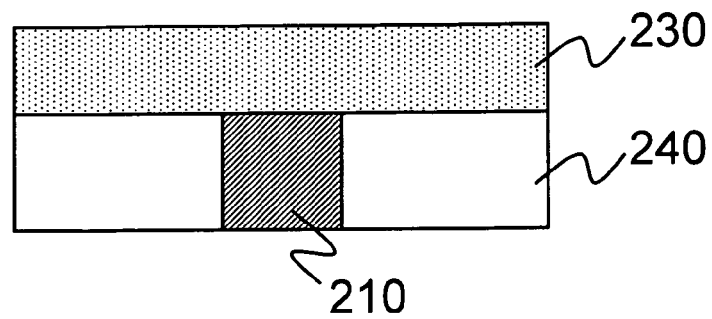
FIG. 12B is a sectional view of an embodiment showing a subsequent fabricating process of the structure as shown in FIG. 12A according to the fabricating method of the invention.

A phase change layer 230 is deposited on the first dielectric layer 240 and the first electrode 210, as shown in FIG. 12B.

Figure 12C:
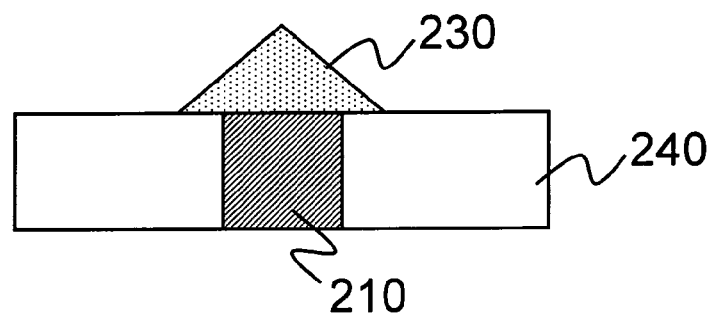
FIG. 12C is a sectional view of an embodiment showing a subsequent fabricating process of the structure as shown in FIG. 12B according to the fabricating method of the invention.
Figure 13A:
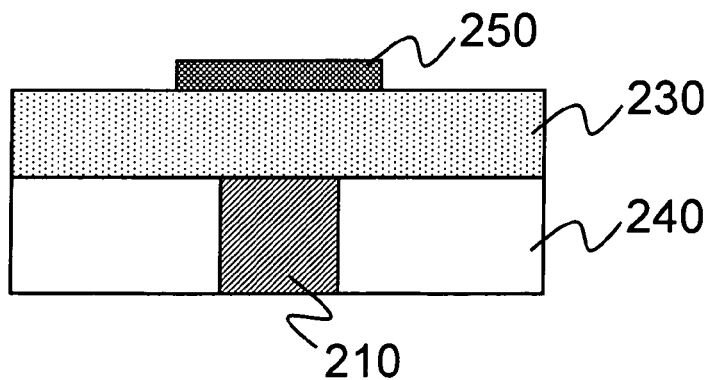
FIGS. 13A and 13B are detailed flow charts showing an embodiment of forming a structure as shown in FIG. 12C.
Figure 13B:
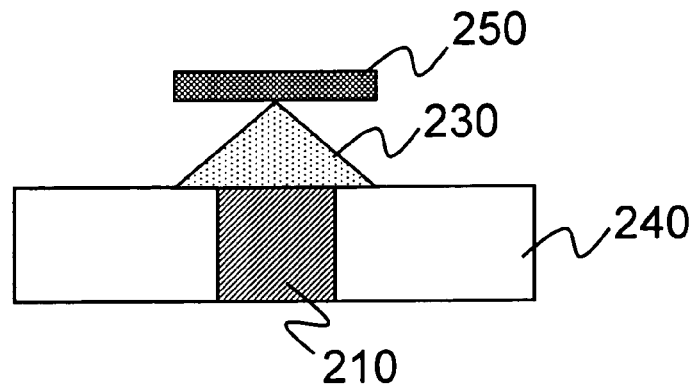

The phase change layer 230 is etched into a tapered structure, as shown in FIG. 12C. A photoresist pattern 250 is formed on the grown phase change layer 230, as shown in FIG. 13A. Then, the region of the phase change layer 230 without being covered by the photoresist pattern 250 as an etching mask is isotropically etched with the photoresist pattern 250, such that the phase change layer 230 is formed into a tapered structure with a large bottom (i.e. the portion close to the first electrode 210), and a small top (i.e. the portion far from the first electrode 210), as shown in FIG. 13B. Finally, the photoresist pattern 250 is removed, such that a structure as shown in FIG. 12C is obtained. An etching mask and etching parameter can be suitably selected to cut the phase change layer into a tapered structure at vertical and horizontal etching rates.

Figure 12D:
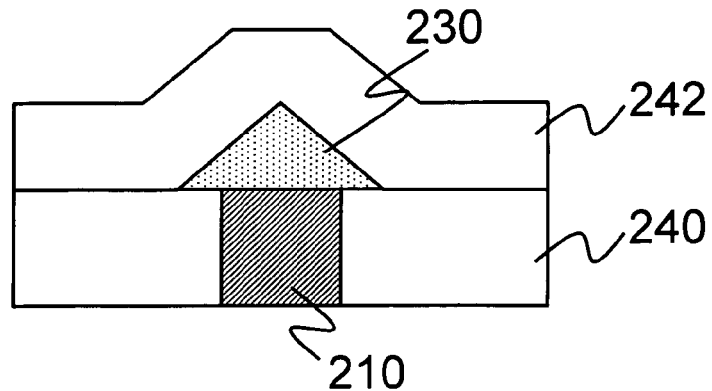
FIG. 12D is a sectional view of an embodiment showing a subsequent fabricating process of the structure as shown in FIG. 12C according to the fabricating method of the invention.

A second dielectric layer 242 is further deposited thereon, as shown in FIG. 12D.

Figure 12E:
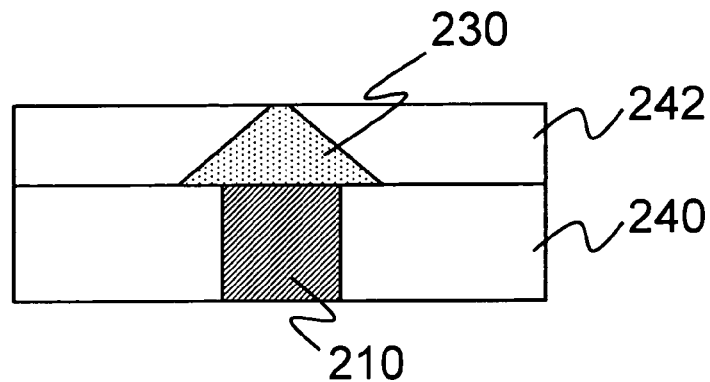
FIG. 12E is a sectional view of an embodiment showing a subsequent fabricating process of the structure as shown in FIG. 12D according to the fabricating method of the invention.
Figure 12F:
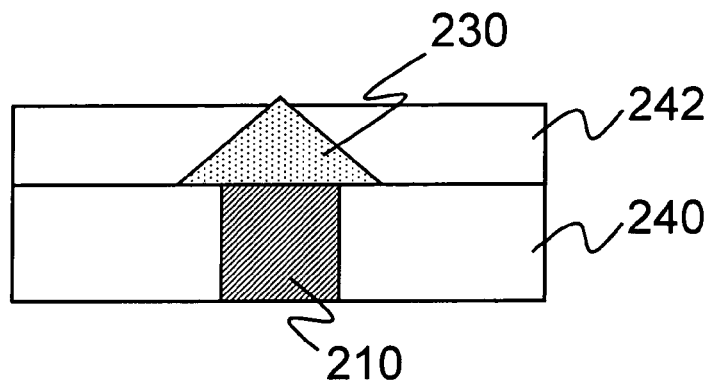
FIG. 12F is a sectional view of an another embodiment showing a subsequent fabricating process of the structure shown in FIG. 12D according to the fabricating method of the invention.

Then, the second dielectric layer 242 is planarized until the tip of the tapered structure (i.e. the phase change layer 230) is exposed, as shown in FIGS. 12E and 12F. The exposed portion is a portion contacting the heating electrode 222. The exposed portion of the phase change layer 230 is a plane (as shown in FIG. 12E), or a pyramid (as shown in FIG. 12F). Therefore, as long as the size of the exposed plane or pyramid of the tip of the phase change layer 230 is controlled to be of an extremely small size, the contact area between the phase change layer 230 and the heating electrode 222 can be reduced; thereby the operation current is lowered. The planarization of the second dielectric layer can be achieved by a Chemical Mechanical Polishing/Planarization (CMP) and/or an Etch back technique.

Figure 14A:
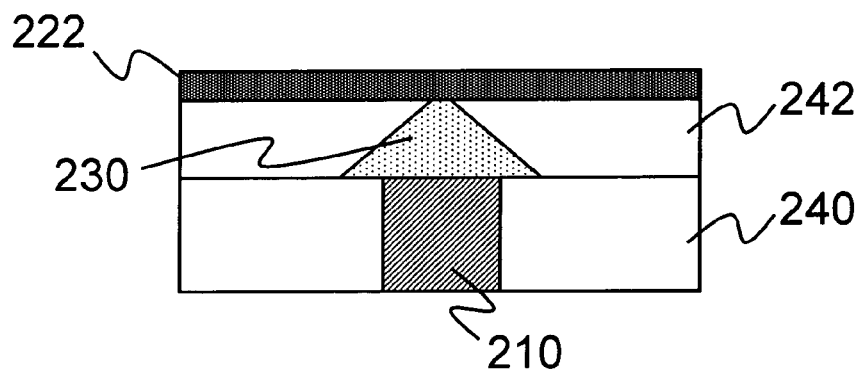
FIGS. 14A, 14B, and 14C are detailed flow charts showing an embodiment of forming a structure as shown in FIG. 6.
Figure 14B:
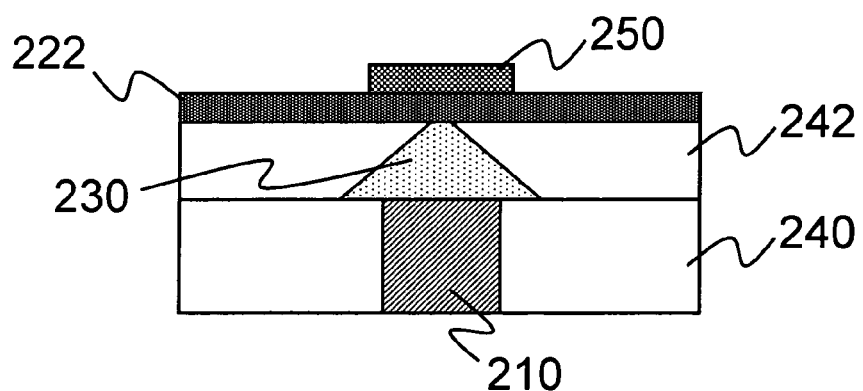
Figure 14C:
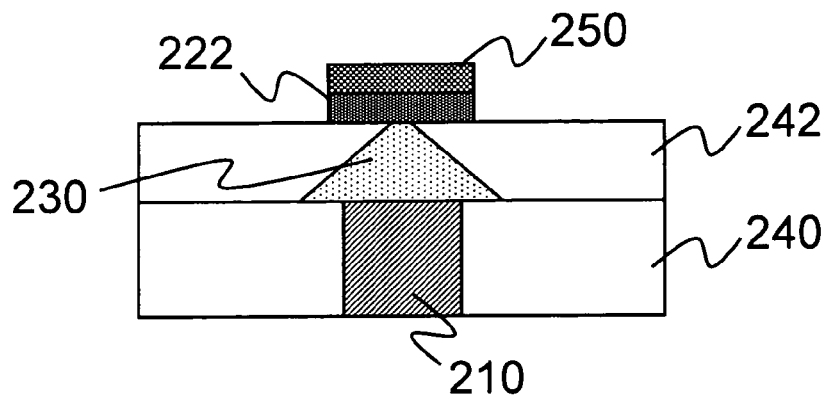
Figure 15A:
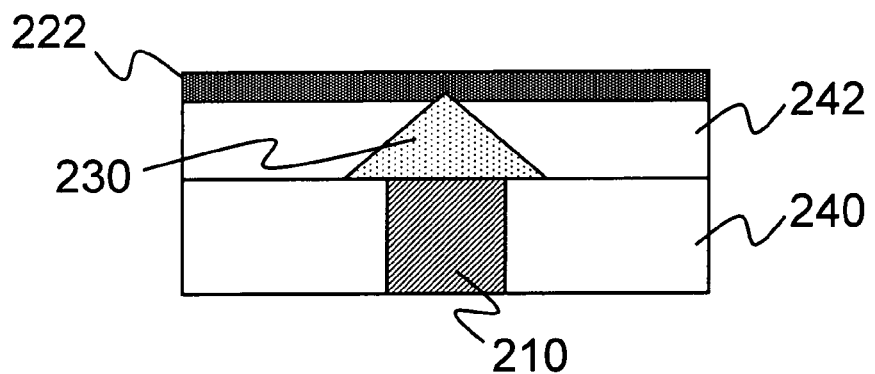
FIGS. 15A, 15B, and 15C are detailed flow charts showing an embodiment of forming a structure as shown in FIG. 7.
Figure 15B:
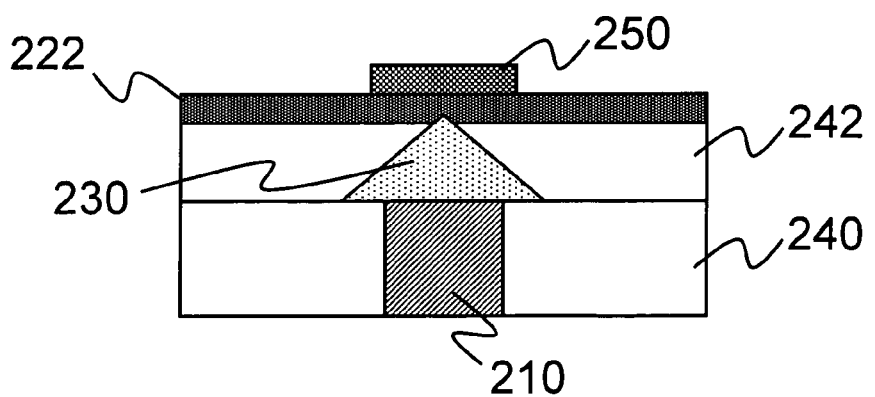
Figure 15C:
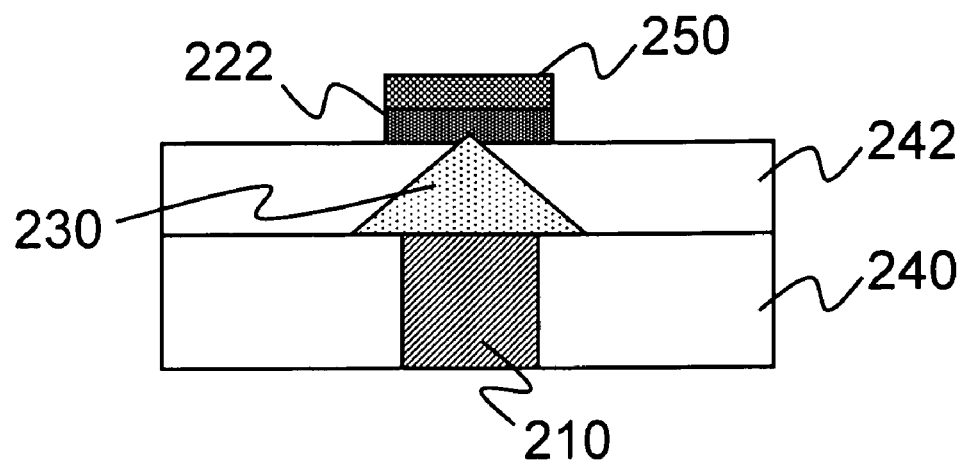

Finally, a heating electrode 222 is formed on the phase change layer 230, so as to generate a Joule heat in the phase change layer, that is, a PCM cell as shown in FIGS. 6 and 7 is obtained. Herein, a heating electrode 222 is grown on the phase change layer 230 at first, as shown in FIGS. 14A and 15A. A photoresist pattern 250 is formed on the heating electrode 222, as shown in FIGS. 14B and 15B. The region of the heating electrode 222 without being covered by the photoresist pattern 250 as an etching mask is etched with the photoresist pattern 250, until the second dielectric layer 242 is exposed, as shown in FIGS. 14C and 15C. Finally, the photoresist pattern 250 is removed, and then the structure as shown in FIGS. 6 and 7 are obtained respectively.

The method for fabricating the PCM cell can be carried out on a substrate successively or on a complementary metal-Oxide semiconductor (CMOS) formed in the pre process.

Figure 16A:
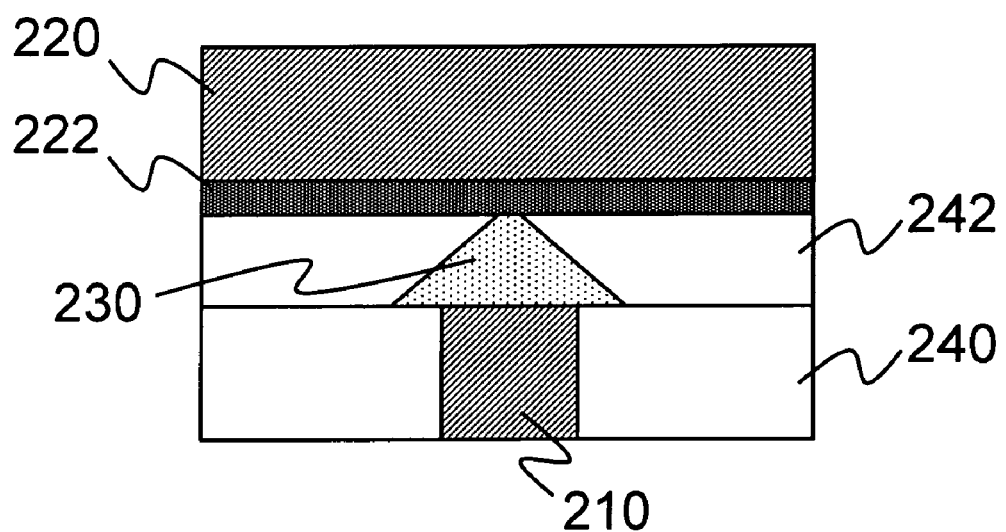
FIGS. 16A, 16B, and 16C are detailed flow charts showing an embodiment of forming a structure as shown in FIG. 8.
Figure 16B:
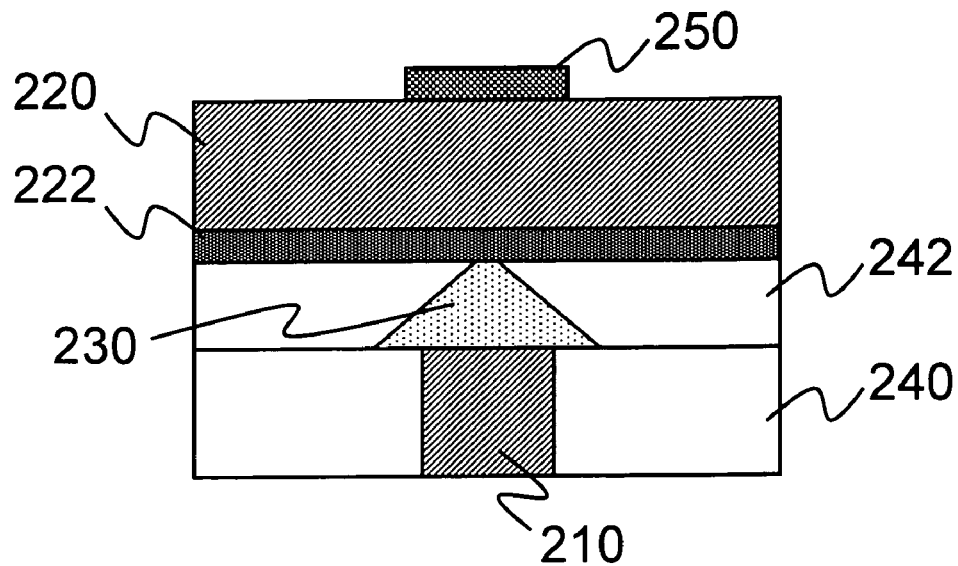
Figure 16C:
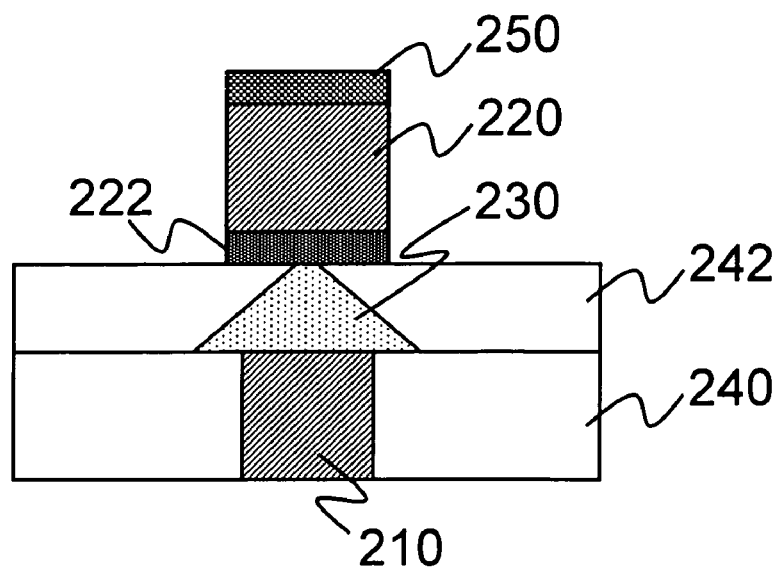
Figure 17A:
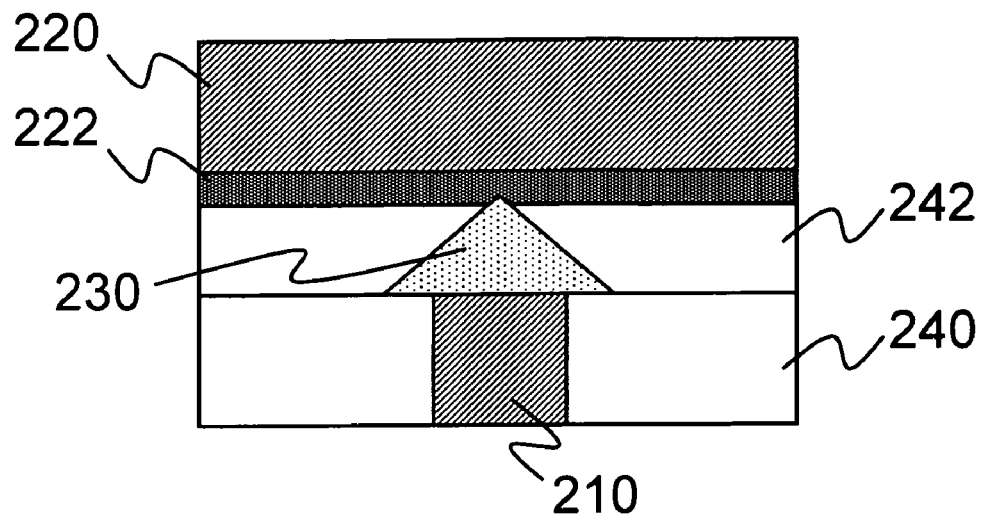
FIGS. 17A, 17B, and 17C are detailed flow charts showing an embodiment of forming a structure as shown in FIG. 9.
Figure 17B:
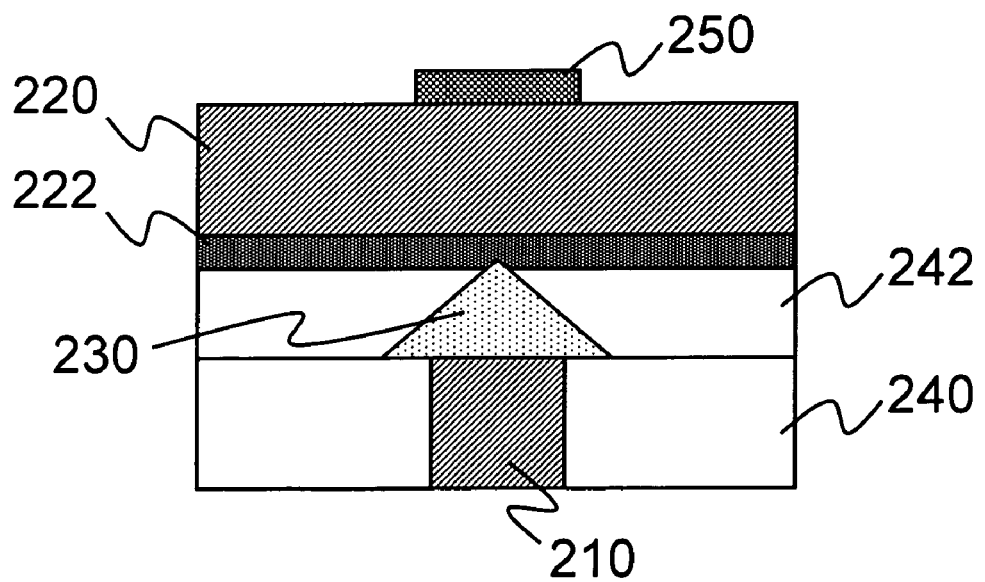
Figure 17C:
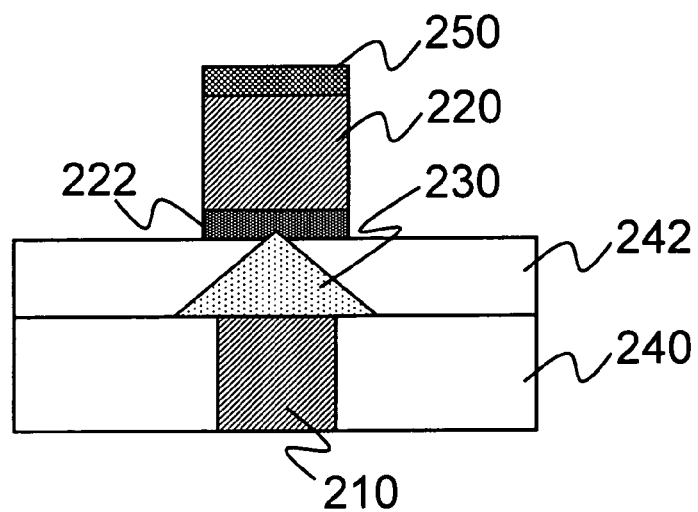

Moreover, the heating electrode 222 and the second electrode 220 are formed on the phase change layer 230 sequentially, so as to obtain the PCM cells as shown in FIGS. 8 and 9. The heating electrode 222 and the second electrode 220 are sequentially formed on the phase change layer 230, as shown in FIGS. 16A and 17A. Then, a photoresist pattern 250 is formed on the second electrode 220, as shown in FIGS. 16B and 17B. The region of the heating electrode 222 without being covered by the photoresist pattern 250 as an etching mask is etched with the photoresist pattern 250, until the second dielectric layer 242 is exposed, as shown in FIGS. 16C and 17C. Finally, the photoresist pattern 250 is removed, and then the structure as shown in FIGS. 8 and 9 can be obtained respectively.

Figure 18A:
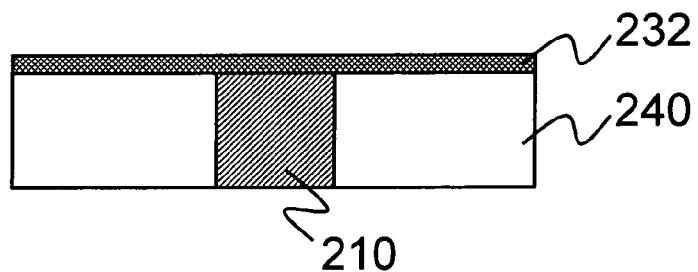
FIG. 18A is a sectional view of an another embodiment showing a subsequent fabricating process of the structure as shown in FIG. 12A according to the fabricating method of the invention.
Figure 18B:
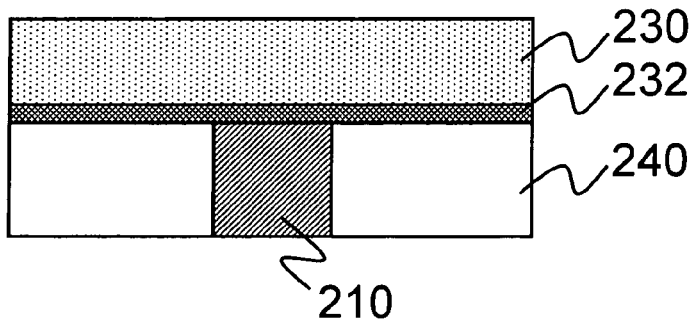
FIG. 18B is a sectional view of an embodiment showing a subsequent fabricating process of the structure as shown in FIG. 18A according to the fabricating method of the invention.
Figure 18C:
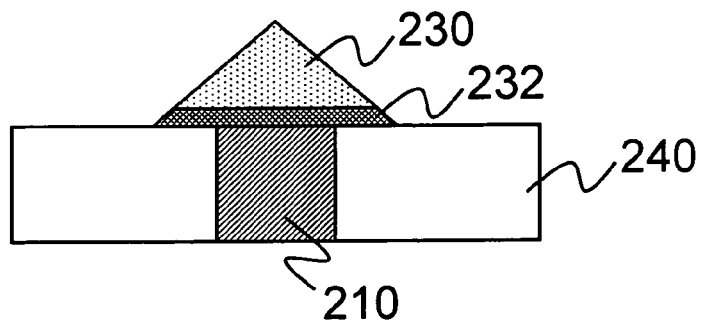
FIG. 18C is a sectional view of an embodiment showing a subsequent fabricating process of the structure as shown in FIG. 18B according to the fabricating method of the invention.
Figure 18D:
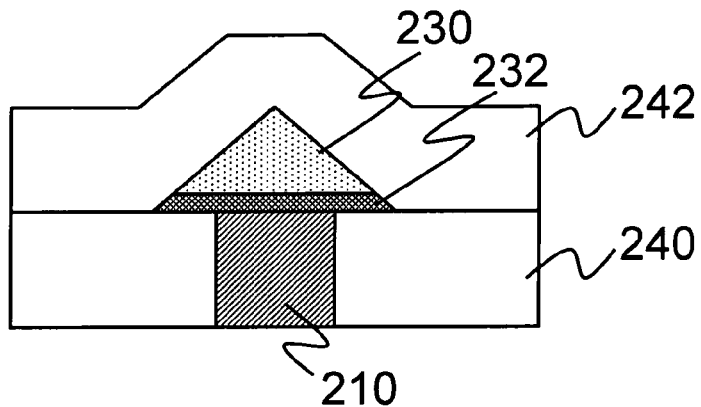
FIG. 18D is a sectional view of an embodiment showing a subsequent fabricating process of the structure as shown in FIG. 18C according to the fabricating Method of the invention.
Figure 18E:
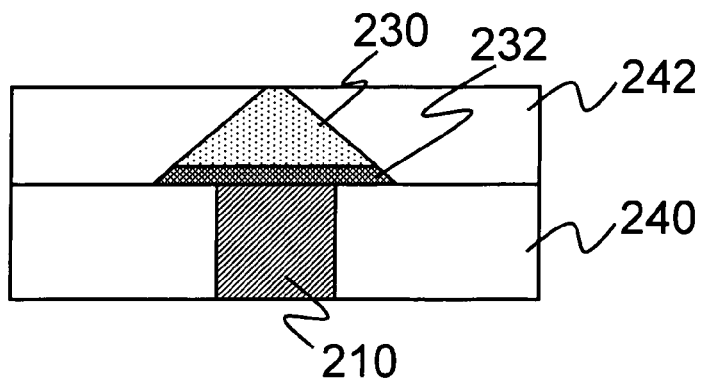
FIG. 18E is a sectional view of an embodiment showing a subsequent fabricating process of the structure as shown in FIG. 18D according to the fabricating method of the invention.
Figure 18F:
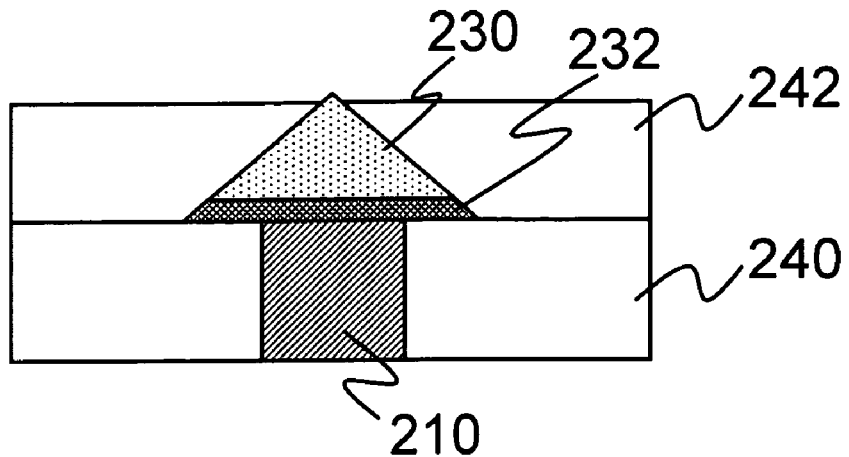
FIG. 18F is a sectional view of an another embodiment showing a subsequent fabricating process of the structure as shown in FIG. 18D according to the fabricating method of the invention.

Moreover, a diffusion barrier layer can be deposited before depositing the phase change layer, to prevent mutual diffusion of the metal materials between the phase change layer and the first electrode. A first dielectric layer 240 with a first electrode 210 is provided, as shown in FIG. 12A. Then, a diffusion barrier layer 232 is deposited on the first dielectric layer 240 and the first electrode 210, as shown in FIG. 18A. A phase change layer 230 is deposited on the diffusion barrier layer 232, as shown in FIG. 18B. Then the phase change layer 230 and the diffusion barrier layer 232 are etched, until the first dielectric layer 240 is exposed, and the phase change layer 230 is etched into a tapered structure, as shown in FIG. 18C. A second dielectric layer 242 is deposited thereon, as shown in FIG. 18D. The second dielectric layer 242 is planarized, until the tip of the tapered structure (i.e. the phase change layer 230) is exposed, as shown in FIGS. 18E and 18F. Finally, a heating electrode 222 is formed on the phase change layer 230, to generate a Joule heat in the phase change layer, that is, the PCM cell as shown in FIGS. 10 and 11 are obtained. The exposed portion of the phase change layer 230 can be a plane (as shown in FIG. 18E) or a pyramid (as shown in FIG. 18F). Therefore, as long as the size of the exposed plane or pyramid of the tip of the phase change layer 230 is controlled to be of an extremely small size, the contact area between the phase change layer 230 and the heating electrode 222 can be reduced; thereby the operation current is lowered. The planarization of the second dielectric layer can be achieved by a CMP and/or an Etch back technique.

Figure 19:
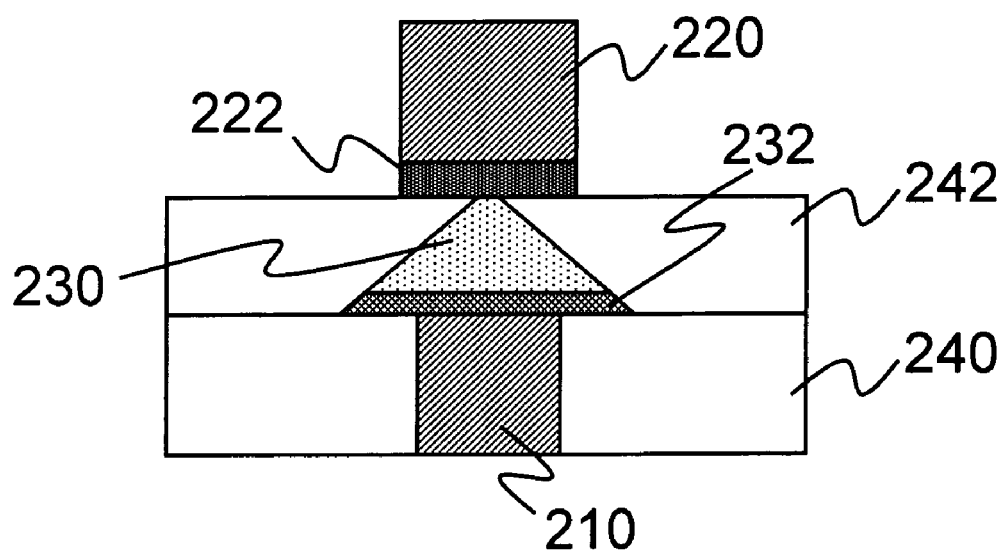
FIG. 19 is a sectional view of a PCM cell according to a seventh embodiment of the invention.
Figure 20:
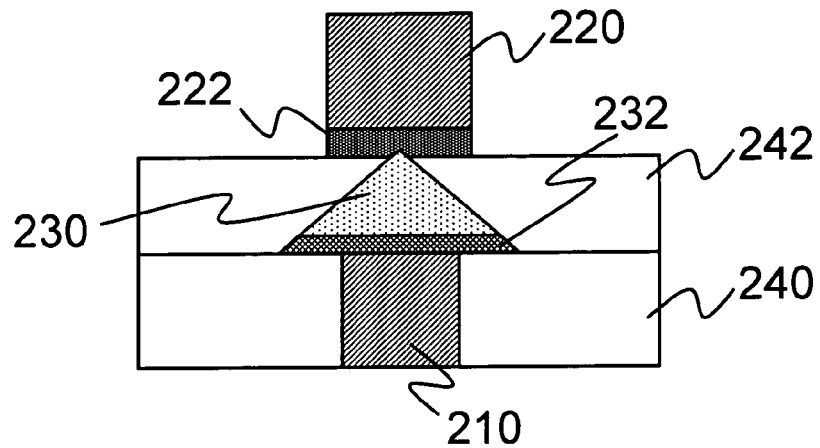
FIG. 20 is a sectional view of a PCM cell according to an eighth embodiment of the invention.

Moreover, the heating electrode 222 and the second electrode 220 can be sequentially formed on the phase change layer 230, as shown in FIGS. 19 and 20.

Figure 21A:
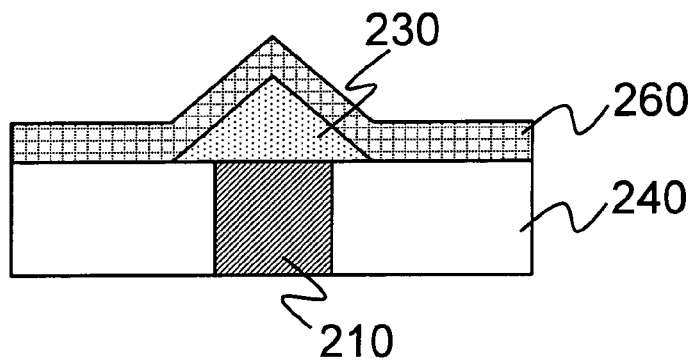
FIG. 21A is a sectional view of an another embodiment showing a subsequent fabricating process of the structure as shown in FIG. 12C according to the fabricating method of the invention.
Figure 21B:
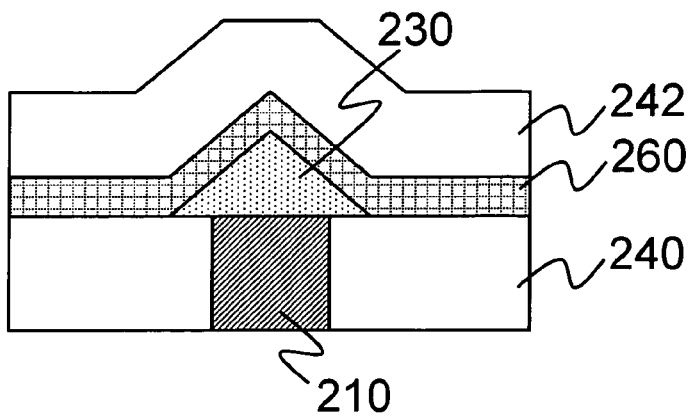
FIG. 21B is a sectional view of an embodiment showing a subsequent fabricating process of the structure as shown in FIG. 21A according to the fabricating method of the invention.
Figure 21C:
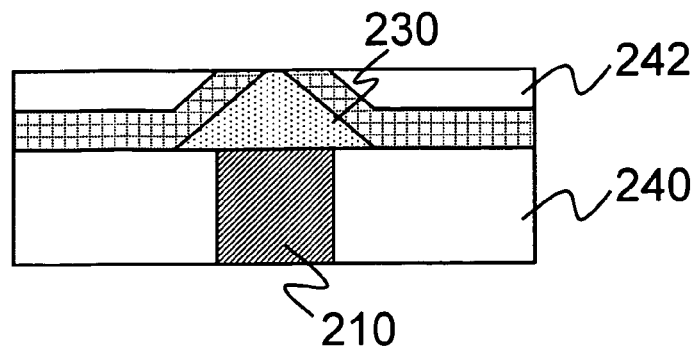
FIG. 21C is a sectional view of an embodiment showing a subsequent fabricating process of the structure as shown in FIG. 21B according to the fabricating method of the invention.
Figure 21D:
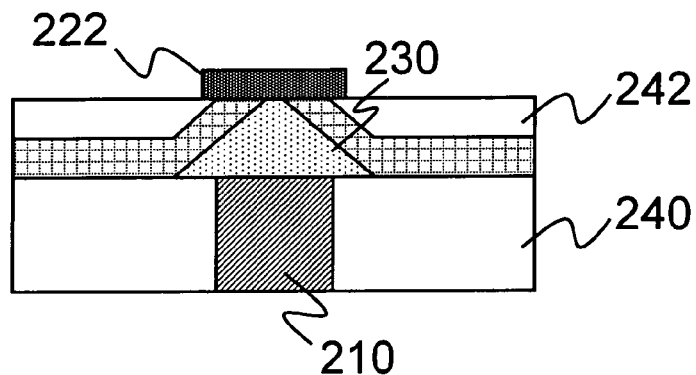
FIG. 21D is a sectional view of a PCM cell according to a ninth embodiment of the invention.
Figure 22A:
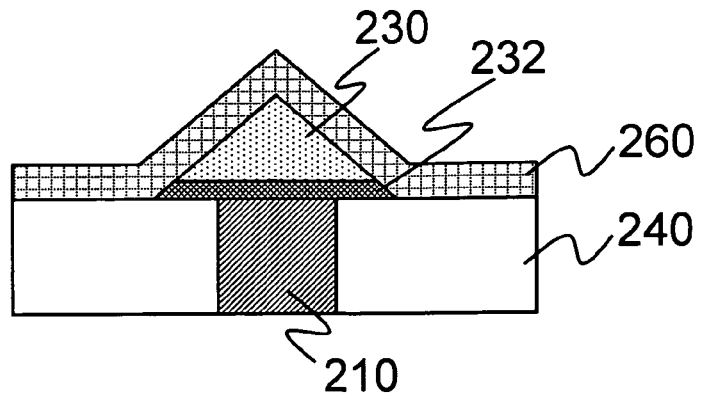
FIG. 22A is a sectional view of an another embodiment showing a subsequent fabricating process of the structure as shown in FIG. 18C according to the fabricating method of the invention.
Figure 22B:
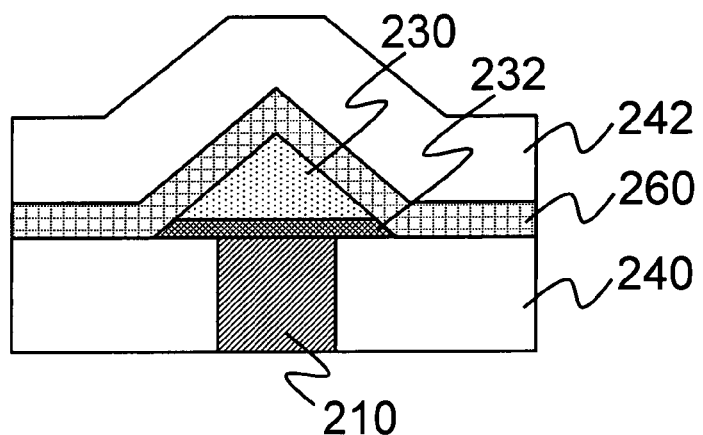
FIG. 22B is a sectional view of an embodiment showing a subsequent fabricating process of the structure as shown in FIG. 22A according to the fabricating method of the invention.
Figure 22C:
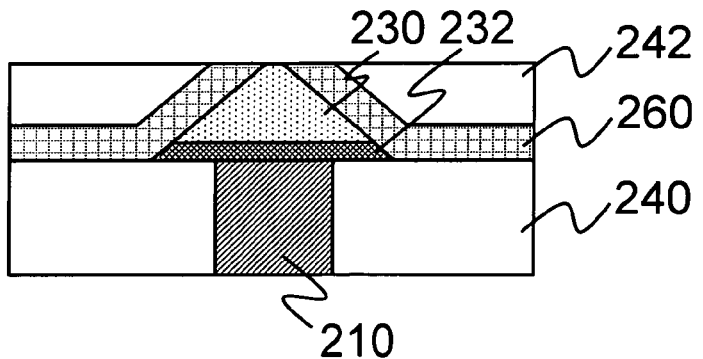
FIG. 22C is a sectional view of an embodiment showing a subsequent fabricating process of the structure as shown in FIG. 22B according to the fabricating method of the invention.
Figure 22D:
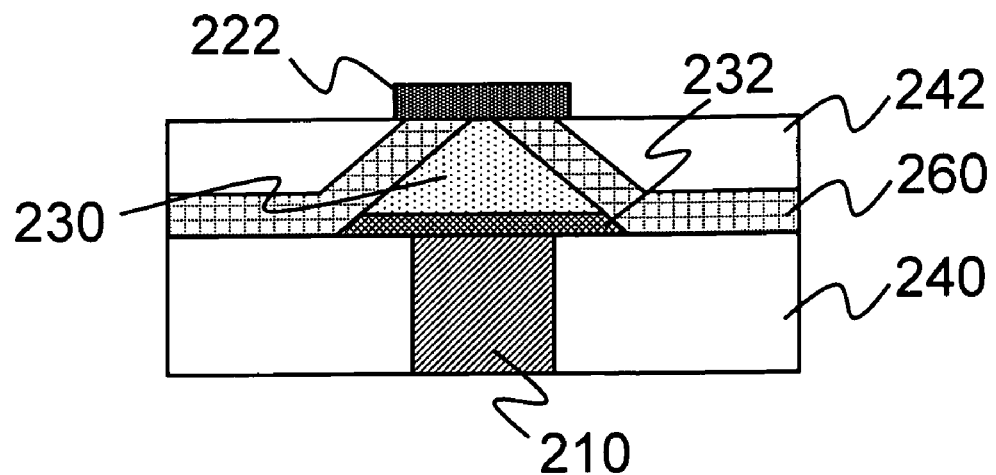
FIG. 22D is a sectional view of a PCM cell according to an eleventh embodiment of the invention.

Furthermore, when the planarization of the second dielectric layer 242 is carried out by the CMP, a stop layer 260 is deposited on the phase change layer 230 before depositing the second dielectric layer 242, so as to control the occasion to stop performing the CMP, as shown in FIGS. 21A and 22A. Then, a second dielectric layer 242 is deposited on the stop layer 260, as shown in FIGS. 21B and 22B. The second dielectric layer 242 is planarized by the CMP, until the tip of the tapered structure (i.e. the phase change layer 230) is exposed, as shown in FIGS. 21C and 22C. Finally, a heating electrode 222 is formed on the phase change layer 230, to generate a Joule heat in the phase change layer, as shown in FIGS. 21D and 22D. Herein, the exposed portion of the phase change layer 230 can be a plane (as shown in FIGS. 21C and 22C). Therefore, as long as the size of the exposed plane of the tip of the phase change layer 230 is controlled to be of an extremely small size, the contact area between the phase change layer 230 and the heating electrode 222 can be reduced; thereby the operation current is lowered.

Figure 21E:
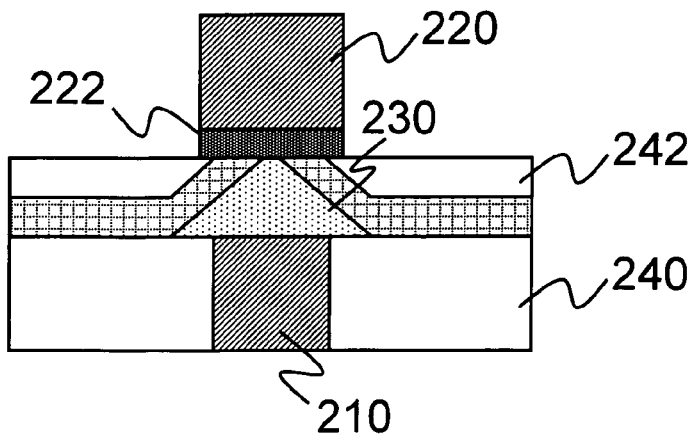
FIG. 21E is a sectional view of a PCM cell according to a tenth embodiment of the invention.
Figure 22E:
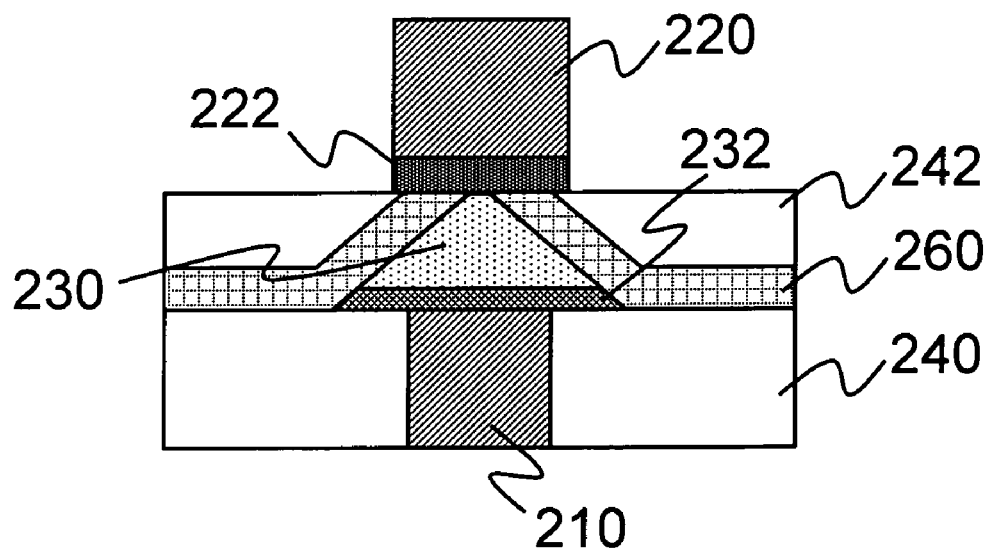
FIG. 22E is a sectional view of a PCM cell according to a twelfth embodiment of the invention.

Moreover, the heating electrode 222 and the second electrode 220 can be sequentially formed on the phase change layer 230, as shown in FIGS. 21E and 22E. The material of the stop layer can be a dielectric material, such as $Si_3N_4$.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A phase change memory (PCM) cell, comprising:
a first dielectric layer;
a first electrode, disposed in the first dielectric layer;
a phase change layer, disposed on the first electrode, and having a tapered structure, wherein an area of a bottom of the tapered structure close to the first electrode is larger than a tip of the tapered structure far from the first electrode;
a second dielectric layer, disposed on the phase change layer, and exposing the tip of the tapered structure; and
a heating electrode, disposed on the second dielectric layer, and contacting the exposed tip of the tapered structure, wherein a vertical projection of the heating electrode onto the bottom of the tapered structure is entirely within outer boundaries of the bottom of the tapered structure.

2. The PCM cell as claimed in claim 1, further comprising: a second electrode, disposed on the heating electrode.

3. The PCM cell as claimed in claim 1, further comprising: a diffusion barrier layer, disposed between the phase change layer and the first electrode.

4. The PCM cell as claimed in claim 1, further comprising: a stop layer, disposed between the phase change layer and the heating electrode.

5. The PCM cell as claimed in claim 1, wherein the tip of the tapered structure exposed by the second dielectric layer is a plane.

6. The PCM cell as claimed in claim 1, wherein the tip of the tapered structure exposed by the second dielectric layer is a pyramid.

7. The PCM cell as claimed in claim 1, wherein the phase change layer consists of the tapered structure.

8. The PCM cell as claimed in claim 1, wherein a vertical projection of the first electrode onto the bottom of the tapered structure is entirely within outer boundaries of the bottom of the tapered structure.

9. A phase change memory (PCM) cell, comprising:
a first dielectric layer;
a first electrode, disposed in the first dielectric layer;
a phase change layer, disposed on the first electrode, and having a tapered structure, wherein an area of a bottom of the tapered structure close to the first electrode is larger than a tip of the tapered structure far from the first electrode, and wherein a vertical projection of the first electrode onto the bottom of the tapered structure is entirely within outer boundaries of the bottom of the tapered structure;
a second dielectric layer, disposed on the phase change layer, and exposing the tip of the tapered structure; and
a heating electrode, disposed on the second dielectric layer, and contacting the exposed tip of the tapered structure.

* * * * *